United States Patent [19]
Possin et al.

[11] Patent Number: 5,777,355
[45] Date of Patent: Jul. 7, 1998

[54] RADIATION IMAGER WITH DISCONTINUOUS DIELECTRIC

[75] Inventors: George Edward Possin; Robert Forrest Kwasnick, both of Niskayuna; Jianqiang Liu, Clifton, all of N.Y.

[73] Assignee: General Electric Company, Schenectady, N.Y.

[21] Appl. No.: 772,446

[22] Filed: Dec. 23, 1996

[51] Int. Cl.$^6$ .......................... H01L 27/148; H01L 31/00
[52] U.S. Cl. .......................... 257/233; 257/291; 257/443; 257/446
[58] Field of Search .......................... 257/443, 446, 257/448, 452, 457, 459, 466, 626, 233, 290, 291

[56] References Cited

U.S. PATENT DOCUMENTS 5,233,181 8/1993 Kwasnick et al. .................. 250/208.1
5,631,473 5/1997 Possin et al. ........................... 257/59
5,648,654 7/1997 Possin ................................ 250/208.1

OTHER PUBLICATIONS

"Two Dimentionsal Amosphous Silicon Imager Sensor Arrays", R. A. Street et al., Amorphous Silicon Technology—1995, Materials Research Society Symposium Proceedings vol. 377, pp. 757-766, Apr. 1995.

Primary Examiner—Minh-Loan Tran
Attorney, Agent, or Firm—Donald S. Ingraham; Douglas E. Stoner

[57] ABSTRACT

A radiation imager having a plurality of photosensitive elements has a two-tier passivation layer disposed between the top patterned common electrode contact layer and respective photosensor islands. The top passivation layer is a polymer bridge member disposed between adjacent photodiodes so as to isolate defects such as moisture-induced leakage in any bridge island layer to the two adjacent photodiodes spanned by the bridge island.

10 Claims, 2 Drawing Sheets

RADIATION IMAGER WITH DISCONTINUOUS DIELECTRIC

This invention was made with U.S. Government support under Government Contract No. MDA972-9430028 awarded by DARPA. The U.S. Government has certain rights in this invention.

BACKGROUND OF THE INVENTION

Photosensitive element arrays for converting incident radiant energy into an electrical signal are commonly used in imaging applications, for example, x-ray imagers and facsimile device arrays. Hydrogenated amorphous silicon (a-Si) and alloys of a-Si are commonly used in the fabrication of photosensitive elements due to the advantageous characteristics of a-Si and the relative ease of fabrication. In particular, photosensitive elements, such as photodiodes, can be formed in conjunction with necessary control or switching elements, such as thin film transistors (TFTs), in relatively large area arrays.

Photodiodes typically include an island or body of photosensitive material, such as a-Si, disposed between two electrodes electrically coupled to opposite surfaces of the photodiode body. As incident radiation is absorbed in the a-Si, holes and electrons are produced and move toward the upper or lower surface of the photodiode dependent on the electric field established by the electrodes. The amount of charge collected at the electrodes is a function of the energy flux of the incident light. Periodic measuring of charge collected on a photodiode, and resetting the diode to a known charge condition, is used to process electrical signals generated by the photodiode in response to incident radiation.

Charge leakage is a critical factor in photodiode performance as the loss of charge during a sampling cycle lessens a photodiode's is sensitivity degrades linearity, and increases the noise. The two significant components of charge leakage are area leakage and sidewall leakage. Particularly in smaller diodes in which the area of the sidewalls are relatively large with respect to the overall area of the photodiode, sidewall leakage constitutes the primary source of leakage. Degradation due to exposure to moisture can make sidewall leakage a significant leakage source in almost any size photodiode. It is thus desirable to cover the photodiode body with a passivating layer to limit charge leakage. U. S. Pat. No. 5,233,181 of Robert F. Kwasnick and Jack D. Kingsley entitled Photosensitive Element With Two Layer Passivation Coating and assigned to same assignee as the subject invention discusses in some detail the problem of charge leakage and the use of barriers including a polyimide extending over an inorganic moisture barrier layer over the upper surface of the photosensitive element, except where the electrical layer is in electrical contact with the photosensor island. Other prior art imagers which do not utilize a polyimide often exhibit reduced integrity with regard to pinholes and shorts between the common electrode and underlying conducting layers. The common electrode, such as indium tin oxide (ITO) or metal, is commonly patterned into lines or stripes extending over the imager. While it has been found that a polymer layer between and partially overlying the diodes increase the array integrity with regard to pinholes and shorts between the common electrode and underlying conducting layers, a problem of leaky photodiodes may arise because of unavoidable defects in the barrier layer which is disposed above the common electrode. These defects enable moisture to enter the polyimide and to then spread out to adjacent or neighboring photodiodes, often adversely affecting sidewall leakage in the region of the defect.

It is thus desirable that a photosensitive element imager have diode dielectric layers that reduce diode leakage, reduce the number of shorts between the common electrode and underlying conducting layers, and provide protection against moisture propagation within the layers.

SUMMARY OF THE INVENTION

In accordance with the present invention, a radiation imager includes a plurality of separated photodiodes and a common electrode overlying the photodiodes. A plurality of polymer bridge members are positioned between the common electrode and the photodiodes underlying portions of the common electrode between adjacent photodiodes, separated however from other diodes such that each polymer member extends only between a pair of adjacent photodiodes so as to form a bridge island between the pair of photodiodes. As a result, any leakage defects in a polymer bridge member, such as that resulting from moisture or impurities, only affect the pair of adjacent photodiodes (each photodiode being disposed in a respective pixel); further, the polymer bridge members are typically isolated from one another so that any adverse leakage in a given bridge island does not affect other photodiode pairs.

More particularly, the polymer members overlie a diode passivation bottom layer, thus providing a second diode passivation top layer. Each polymer bridge member overlaps only a portion of the adjacent diodes it bridges. A patterned common electrode overlies the central portion of each photodiode, extending to the edges of the photodiodes only where it overlies the central region of the polymer bridge member between adjacent diodes. The common electrode typically comprises indium tin oxide. The diode passivation bottom layer typically comprises PECVD silicon nitride, silicon oxide or silicon oxynitride or combinations thereof. The polymer bridge member, commonly comprises a layer of preimidized polyimide, having a thickness between about 0.5 and about 2.5 microns.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1:
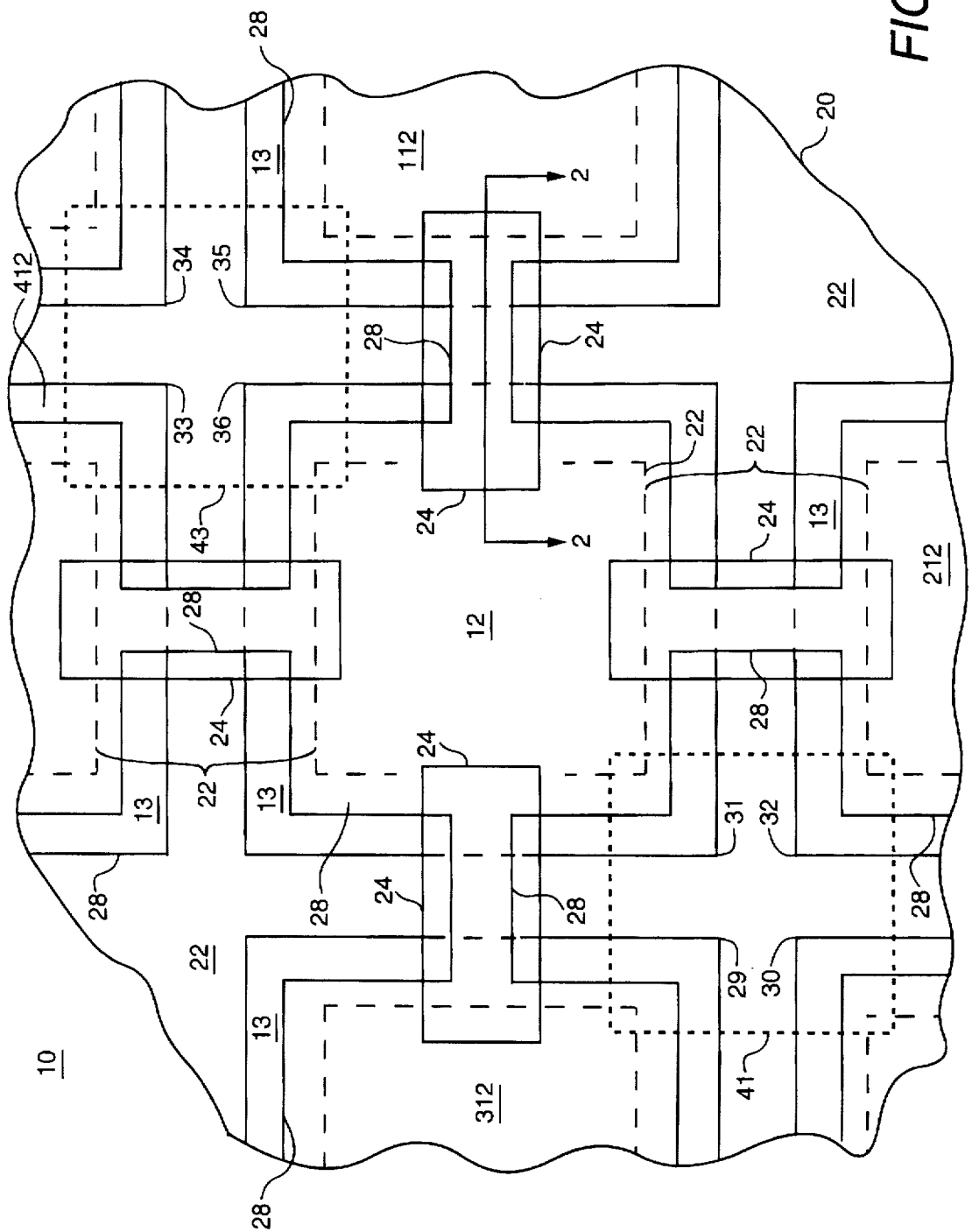
FIG. 1 is a top view of a portion of a radiation imager fabricated in accordance with this invention.
Figure 2:
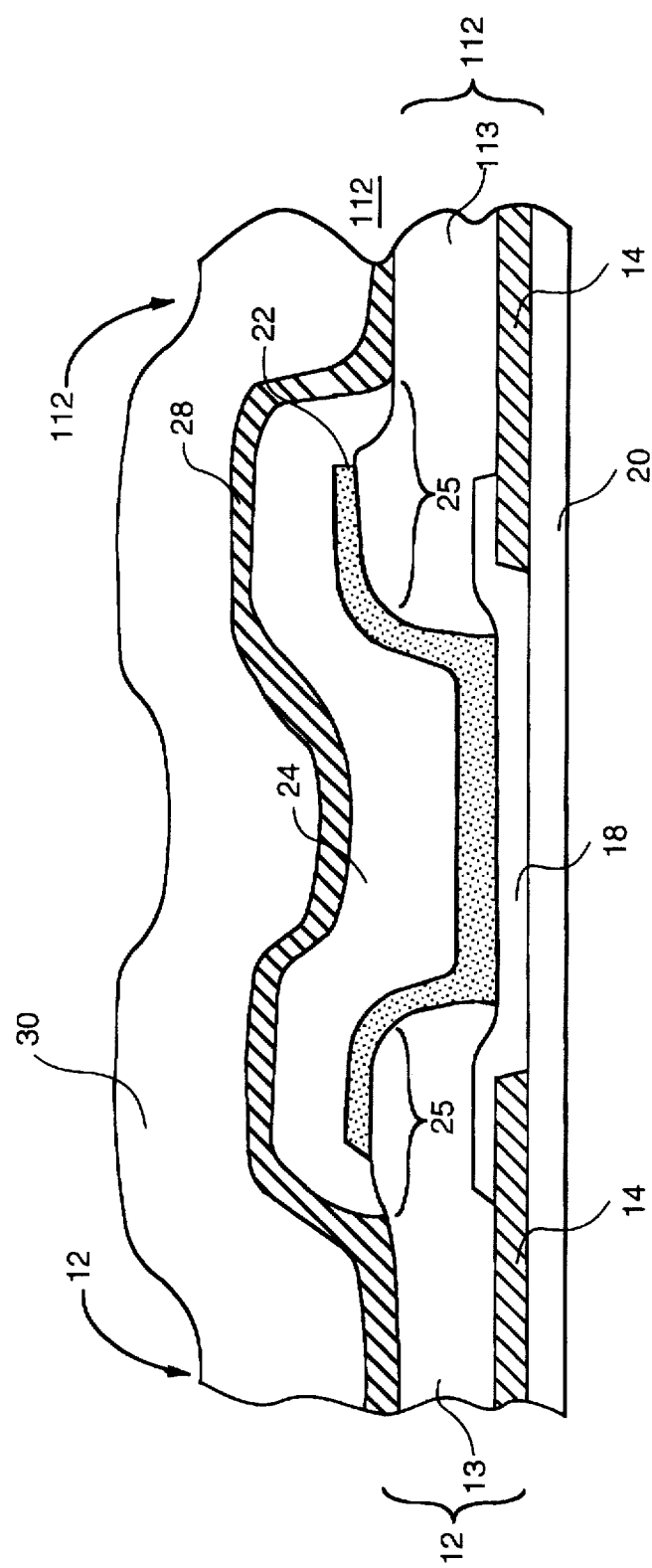
FIG. 2 is a cross-sectional view of a portion of FIG. 1 taken along lines 2—2 of FIG. 1.

As illustrated in FIGS. 1 and 2, a portion of a radiation imager 10 as best shown in FIG. 1 includes a plurality of respective photodiodes 12, 112, 212 and 312, each of which, as best shown in FIG. 2, comprises a metal bottom contact 14 that is disposed on a substrate 20, or alternatively, on another dielectric material (not shown) that is disposed on substrate 20. Respective bottom contacts 14 are disposed under the semiconductive material of each photodiode, e.g., diodes 13 and 113. Gate dielecric layer 18 is disposed on the array between adjacent diode bottom contacts 14. Diode passivation bottom layer 22 is disposed between and over end regions of the Si of adjacent photodiodes 12 and 112. Polymer bridge member 24 is disposed between and over portions of adjacent diodes such as 12 and 112 of radiation imager 10 so as to form a bridge (or platform) on which common electrode 28 is disposed (common electrode 28 being disposed in the array to provide contact between the respective upper contact points on each of the photodiodes in the array. In this arrangment, common electrode 28 is separated from diode passivation bottom layer 22 by bridging element 24. As used herein, "adjacent" refers to photodiodes in imager 12 that are disposed in the matrix arrangement in proximity with one another such that no other photodiode is disposed between diodes in an adjacent pair of diodes. Polymer bridge member 24 typically comprises preimidized polyimide (PI) such as that sold by OCG Microelectronic Materials under the trade name Probromide 286.

As best shown in FIG. 1, both the polymer bridge member 24 and overlying common electrode 28 are patterned as described below to provide the advantages of the present invention. A segment of polymer bridge member 24 extends between adjacent photodiodes such as 12 and 112 and extends over a border region 25 (FIG. 2) of each photodiode in an adjacent pair. Thus respective polymer bridge members 24 are disposed as bridging islands between adjacent photodiodes such as adjacent photodiodes 12 and 112, 12 and 212, 12 and 312, and 12 and 412.

Diode dielectric layer 22 preferably comprises plasma-enhanced chemical vapor deposited (PECVD) silicon nitride (SiNx) disposed in a continuous sheet in the imager array 10 area, except for openings in the top of the photodiodes. Polymer material is typically deposited by spin or meniscus coating. Polymer bridge members 24 are typically patterned by standard photolithographic methods and etching so as to extend past the edges of adjacent photodiodes such as 12 and 112, and past diode passivation bottom layer 22 to the edge regions 25 of adjacent silicon diode islands 13, as best shown in FIG. 2. This enables common electrode layer 28 to form a generally more reliable electrical contact to the top of photodiode 13 by crossing the patterned edge of the polymer dielectric bridge member 24 rather than just the edge of the diode passivation layer 22.

Common electrode 28 typically comprises indium tin oxide (ITO) deposited in a conventional manner such as by sputtering of thickness between approximately 50 nm and 300 nm. Alternative materials for common electrode 28 include indium oxide, tin oxide and zinc oxide. To the extent that common electrode 28 comprises a material that is not optically transmissive, it would be patterned so that most of the photodiode top surface is not covered such that light is not blocked from reaching the photodiode.

Common electrode 28 typically extends only over the central region of the photodiodes such as 12, 112, 212, 312 and 412, and over polymer bridge members 24, positioned, however, within the boundary edges of the upper surfaces of the diodes and also within the edges of the polymer bridge members 24 in the region where the bridge member 24 extends between photodiodes 12 and 112. Disposing the common electrode 28 over the polymer bridge member provides good dielectric insulation while also reducing the number of shorts between the common electrode and the underlying address line due to the polyimide layer underlying the common electrode between adjacent photodiodes.

Barrier layer 30 overlies the array photodiodes, e.g. diodes 12 and 112, and typically comprises silicon nitride, silicon oxide, silicon oxynitride, or combinations thereof deposited by plasma enhanced chemical vapor disposition (PECVD) with thickness between approximately 0.5 and 2.0 microns. The semiconductive material comprising the body of photodiode 13 has a thickness between approximately 0.5 and 2.0 microns.

The total number of polymer bridge members 24 can be reduced by interconnecting or bridging the four adjacent corners such as 29, 30, 31 and 32 of adjacent diode islands 13 by a bridge island 41 shown schematically in FIG. 1 by a dotted line. The diagonally opposite corners of the adjacent diodes are then be similarly interconnected. Corner 36, which is diagonally opposite to corner 31, is shown interconnected to its adjacent diode islands 13 by a bridge island 43 which is represented in phantom in FIG. 1, and which is shown schematically interconnecting the four adjacent diode corners 33, 34, 35 and 36. The use of corner bridge members 41 and 43 in lieu of side bridging by bridge members 24 can reduce the number of bridge islands to a single diode island 13 by one-half.

While only certain features of the invention have been illustrated and described herein, modifications and changes will occur to those skilled in the art. It is, therefore, to be understood that the appended claims are intended to cover such modifications and changes that fall within the true spirit of the invention.

What is claimed is:

1. A radiation imager including a plurality of respective photodiode islands and a common electrode overlying at least a portion of each of said photodiode islands and the region between the photodiode islands, the imager comprising:

a photodiode passivation layer disposed between adjacent photodiode islands and extending over at least a portion of said adjacent photodiode islands; and a plurality of bridge members disposed over said photodiode passivation layer and so as to underlie portions of said common electrode extending between adjacent photodiode islands, each of said bridge members being isolated from one another so that electrical leakage in one bridge member is limited to said one bridge member.

2. The radiation imager of claim 1 wherein each polymer bridge member extends between up to four adjacent photodiode islands.

3. The radiation imager of claim 2 wherein each polymer bridge member extends only between a pair of adjacent photodiodes islands.

4. The radiation imager of claim 2 wherein said polymer bridge member comprises a preimidized polyimide material.

5. The radiation imager of claim 1 wherein said photodiode passivation layer is disposed as a continuous layer over edges of said photodiode stands without covering the entire surface of said photodiode islands.

6. The radiation imager of claim 5 wherein said polymer bridge member extends beyond a portion of said photodiode passivation layer at respective edges of said photodiode islands so as to contact the surface of each of said photodiode islands.

7. The radiation imager of claim 5 wherein said common electrode overlies the central portion of the upper surface of each of said photodiode islands, said common electrode being disposed so as to extend beyond said upper surface of each respective photodiode island only over said polymer bridge members.

8. The radiation imager of claim 7 wherein said common electrode comprises a conductive material selected from the group consisting of indium tin oxide, zinc oxide, tin oxide, indium oxide, and metal.

9. The radiation imager of claim 8 wherein said photodiode passivation layer comprises a dielectric material selected from the group consisting of silicon oxide and silicon nitride and combinations thereof.

10. The radiation imager of claim 1 wherein each of said polymer bridge members are in the form of rectangular islands extending between two adjacent photodiode islands.

* * * * *